United States Patent [19]

Carpenter et al.

[11] Patent Number: 4,750,087
[45] Date of Patent: * Jun. 7, 1988

[54] VENTILATED INSTRUMENT PANEL SUPPORT RAIL

[75] Inventors: Paul E. Carpenter, Snohomish; Charles B. Fisher, Seattle; Douglas E. Peash, Enumclaw, all of Wash.

[73] Assignee: The Boeing Company, Seattle, Wash.

[*] Notice: The portion of the term of this patent subsequent to May 28, 2002 has been disclaimed.

[21] Appl. No.: 836,895

[22] Filed: Apr. 28, 1986

Related U.S. Application Data

[63] Continuation of Ser. No. 592,775, Mar. 26, 1984, abandoned, which is a continuation-in-part of Ser. No. 105,832, Dec. 20, 1979, abandoned.

[51] Int. Cl.⁴ ............................................. H05K 7/20
[52] U.S. Cl. .................................. 361/383; 62/418; 361/384
[58] Field of Search .................... 62/418; 165/41; 174/16 R; 361/379, 380, 381–384, 391–394, 420, 429, 386, 388

[56] References Cited

U.S. PATENT DOCUMENTS

| | | | |
|---|---|---|---|
| 3,541,395 | 11/1970 | Lucchino | 361/383 |
| 3,956,673 | 5/1976 | Seid | 361/383 |
| 4,044,515 | 8/1977 | Holling-seid | 237/178 |
| 4,093,021 | 6/1978 | Groom | 361/384 |
| 4,149,218 | 4/1979 | Carrubba | 361/383 |
| 4,520,424 | 5/1985 | Carpenter | 361/383 |

OTHER PUBLICATIONS

Machine Base, Lindner, IBM Tech. Discl. Bull., vol. 16, No. 3, Aug. 1973, p. 905.

Primary Examiner—G. P. Tolin
Attorney, Agent, or Firm—Conrad O. Gardner; B. A. Donahue

[57] ABSTRACT

A support rail structure which provides cooling air for removing heat from instruments. The support rail structures provide uniform cooling along each support rail regardless of instrument orientation within the instrument panel assembly. A system which includes the combination of instrument panel support rail and cooling mainfold discharges a continuous flow of forced convection air along the base of the support rail. Valves are shown which provide flow-through cooling for cathode ray tube instruments. The instrument panel support rail structures enable a method of supplying conditioned air when concentration of instrument panels dictate that the air conditioning system be integrated within the panels.

2 Claims, 3 Drawing Sheets

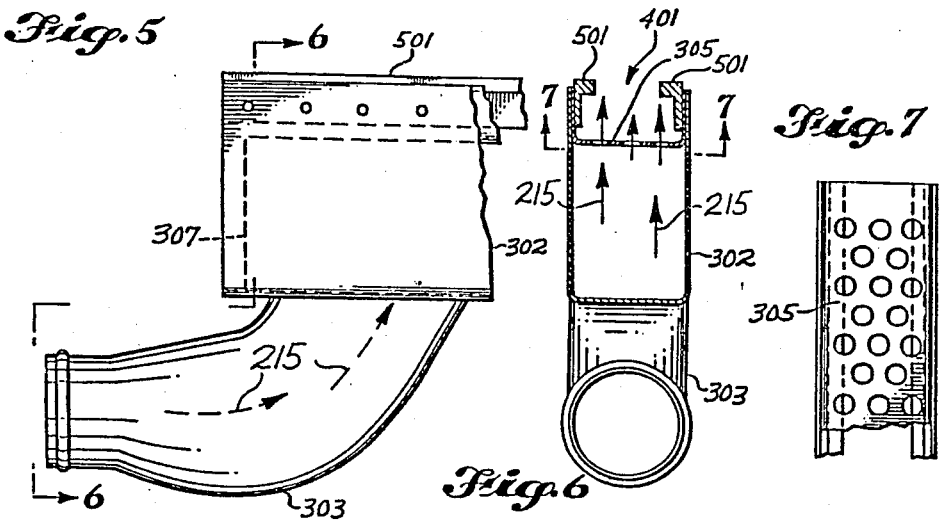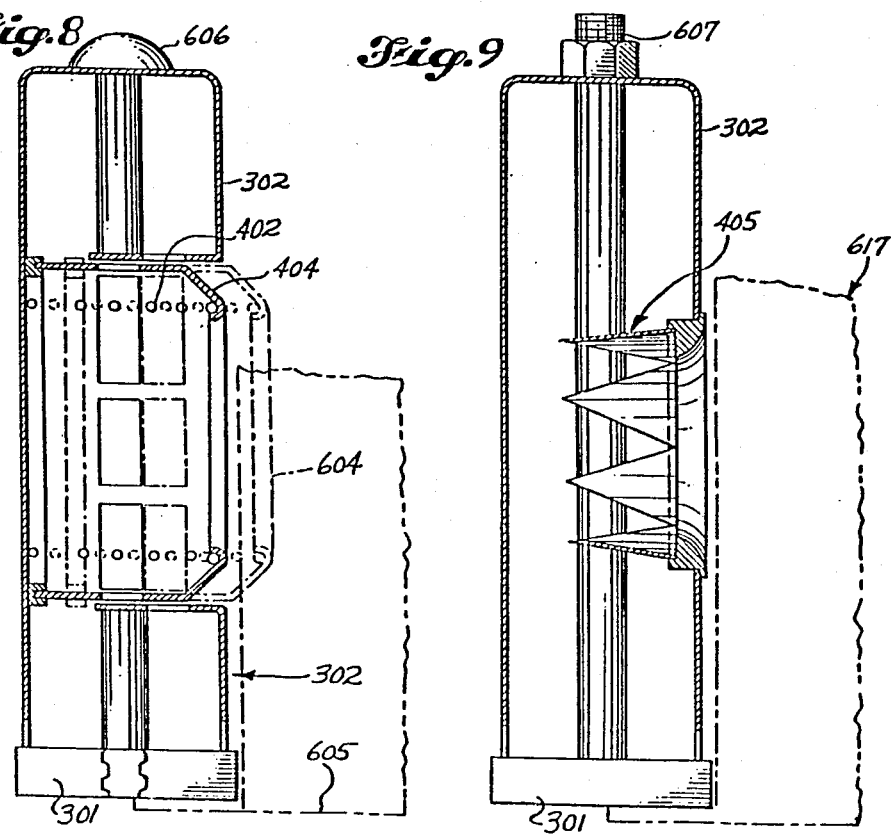

VENTILATED INSTRUMENT PANEL SUPPORT RAIL

This is a continuation of application Ser. No. 592,775 now abandoned, filed Mar. 26, 1984 which is a continuation-in-part of U.S. patent application Ser. No. 105,832 filed Dec. 20, 1979 now abandoned and assigned to The Boeing Company The present invention relates to cooling of flight deck instrument panels in aircraft and more particularly to ventilated instrument panel support rail structures for providing cooling air blowing or heated instrument air extraction for rail mounted instruments.

Currently, flight deck instruments on fleets of commercial aircraft are cooled by nozzles which direct an air spray in the vicinity of instrument panels. Such spray nozzle orientation does not concern itself with instrument orientation within the panel or the wire routing between instruments and disconnects. As a result, hot spots often occur in the panels which tend to produce premature failure of instrument electronic components.

In the patent literature, U.S. Pat. No. 3,541,395 is illustrative of a rack for supporting and cooling avionic equipment and including a pair of guide rails adapted to be adjustably attached to a pair of horizontal support member for receiving avionic equipment of various physical dimensions. A cross duct is located between the guide rails in communication with a central duct means for providing individual air cooling to the avionic equipment. The cooling air is ducted to a portion of the bottom side of the avionic equipment. In contrast, the present ventilated instrument panel support rails provide cooling air within the support rails thereby providing air uniformly along rail structures for distribution.

A further literature reference includes U.S. Pat. No. 4,093,021 which shows an instrument and panel cooling apparatus in which each instrument is cooled uniformly by air flowing from the plenum through the plurality of small orifices shown. In contrast, the present cooling air is provided within the instrument support rails and uniformly along each rail.

It might be noted that U.S. Pat. Nos. 3,541,395 and 4,044,515 relate to cooling of air transport racks (ATR) mounted equipment per ARINC 404A and 600 wherein an equipment tray with integral gasket is permanently mounted to the cooling duct/support. This equipment is mechanically attached to the tray. These arrangements may be contrasted to the present ventilated instrument panel support rail means for introducing the cooling air. ARINC denotes Aeronautical Radio, Inc., a commercial company which serves the aircraft industry by establishing universally accepted standards on such matters U.S. Pat. No. 4,093,021 referenced earlier is directed to cooling of clamp mounted instruments per ARINC 408A wherein the entire instrument panel becomes a dual wall duct with discharge orifices surrounding each of the instruments. Such an approach may be contrasted to the cooling structures and systems utilizing the present ventilated instrument panel support rails.

It is accordingly an object of the present invention to provide panel support rail structures which include means for cooled air blowing or heated instrument air extraction for rail mounted instruments. It is a further object of the present invention to provide systems which include means for providing uniform cooling along support rails irrespective of instrument orientation within associated panel assemblies. It is yet another object of the present invention to provide hollow instrument panel support rails which may be sandwiched physically in the unused spaces between adjacent modules thereby eliminating the requirements of spray tubes and their supports and associated structure.

A full understanding of the present invention, and of its further objects and advantages and the several unique aspects thereof, will be had from the following description when taken in conjuction with the accompanying drawings in which:

FIG. 5 is a side view of a ventilated support rail structure utilized for conditioned air outlet;

FIG. 6 is a section taken along the lines 6—6 of FIG. 5 and illustrative of the air flow restrictor and air plenum features of the present invention;

FIG. 7 is a section taken along the lines 7—7 of FIG. 6 which provides a view of the air flow restrictor plate;

FIG. 8 is a section taken through a ventilated support rail showing pressurization port in which the valve is shown in open and closed positions;

FIG. 9 is a view in section through a ventilated support rail structure showing multiple lobe check valve arrangement in the open position, and including a reference control panel fitted with a spring loaded detent (not shown); and, FIG. 10 is a perspective view of a further embodiment of the present instrument module cooling system.

Figure 1:
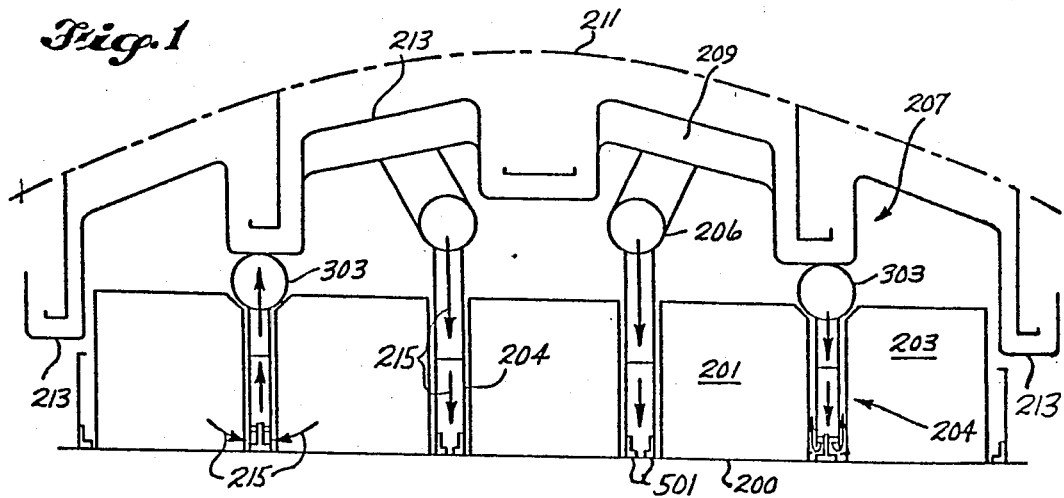
FIG. 1 is a rear view through a flight deck overhead panel which incorporates the present ventilated support rail structures for distributing conditioned air and instrument cooling air.

Turning now to FIG. 1, an instrument panel 200 is shown supported in a highly congested area. The present ventilated support rail 204 can be seen coupled through duct 206 to air duct 209. Duct 209 is integrated as a portion of dripshield 213. Air flow paths through several further ventilated instrument panel support structures including 204 are illustrated by the arrows represented at 215. Air flow paths throughout the system of ventilated support rails are also shown. It should be noted that ventilated instrument panel support rail 204 is disposed in the space intermediate modules 201 and 203. The region 207 is occupied by wiring (not shown). Airplane skin at 211 is shown for reference. Dripshields are shown at various positions of the assembly of FIG. 1; for example, on the left hand side of the Figure an denoted by numeral 213. Dripshield 213 is utilized as an insulating and condensation barrier between the instruments 201, 203, wiring region 207, and the airplane skin 211. FIG. 1 is included to provide a general layout configuration of the system with respect to a forward overhead panel. On a conventional instrument panel assembly, the panel support rails are welded or mechanically attached to a framework which supports the instrument modules 201 and 203.

Figure 2:
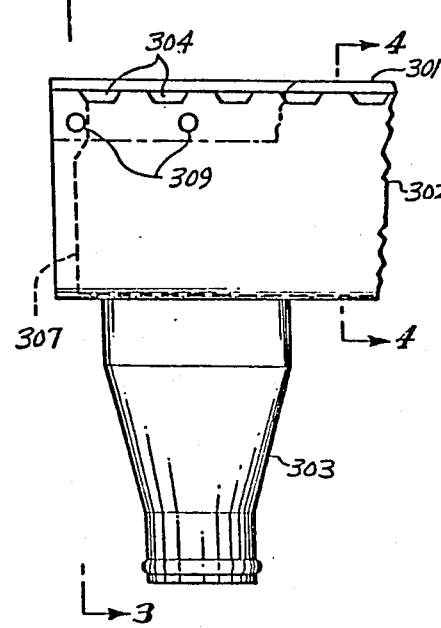
FIG. 2 is a side view of the present ventilated instrument panel support rail structure.

Proceeding now to further detail of the specifics of the present ventilated instrument panel support rail configuration and FIG. 2, it will be observed that in the present method of cooling mounted instruments and control panels, a cooling air source manifold 302 is integrated within the support rail 301.

Figure 3:
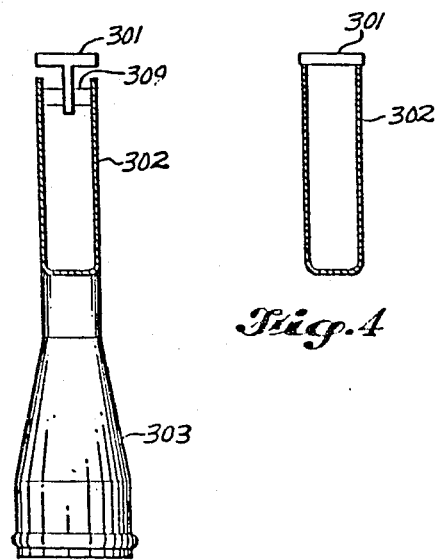
FIG. 3 is a sectional view taken along the lines 3—3 of FIG. 2 and illustrative of a riveted support rail assembly configuration.

The support rail assembly incorporates a distribution manifold 302, a support rail 301, to which instrument modules 201 and 203 are normally attached, and end caps 307 which abut the instrument panel framework. Spacers/fasteners 309 afix the dual panel support rail 301 to 302. Supply tube 303, afixed to manifold 302, is normally connected to supply air ducting 209 via flexible tubing. FIG. 3 is a cross-section through the rail assembly 204 which shows the relationship between manifold 302, supply tube 303, support rail 301; and illustrates the controlled air passages 304 between 301 and 302 which disperse cooling air to adjacent instrument modules.

Figure 4:
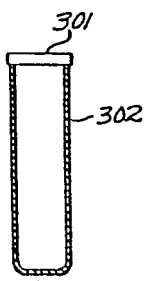
FIG. 4 is a section taken along the lines 4—4 of FIG. 2 showing a welded panel support rail assembly.

FIG. 4 is a section through 301 and 302 between adjacent 304 air dispersion passages. An alternate application of support rail 204 is illustrated by FIGS. 5, 6 and 7, wherein conditioned air is dispersed to the flight crew through passage 401. The configuration incorporates a distribution manifold 302, which receives air from supply tube 303, controls discharge flow via integral restrictor 305 and disperses the air into the flight deck through passage 401. Single lobe support rails 501 provide attachment for instrument modules 201 and 203.

Advanced navigational and engine monitoring instrumentation incorporates cathode ray tubes (CRT's) 605 and 617 and keyboards to display a multiple of events on a single instrument. The CRT's have a high heat dissipation rate and require dedicated cooling air to prevent overheat and burn-out. FIG. 8 illustrates a means of supporting and cooling CRT 605 via interconnect to an embodiment of support rail assembly 204. The distribution manifold is fitted with a spring loaded, circular cross-section valve 404. The valve 404 is located to align with a circular pressurization port in the CRT 605.

Upon attaching the CRT to the support rail 301, spring 402 moves the valve to the open position 604 and allows airflow from manifold 302 to CRT 605. Should an instrument without porting be installed in the area, the valve will remain depressed in the closed position 404.

An alternate means of supplying cooling air to CRT instruments is illustrated in FIG. 9, wherein CRT 617 is fitted with a spring loaded detent (not shown) and manifold 302 is fitted with a normally closed, circular crosssection, multiple lobe check valve. Upon attaching, a spring loaded detent in CRT 617 extends to the lobes 405 of the valve to allow airflow from manifold 302 to CRT 617.

Bolt 606 shown in FIG. 8 and welded stud/nut 607 shown in FIG. 9 are alternate methods of attaching manifold 302 to support rail 301.

Figure 10:
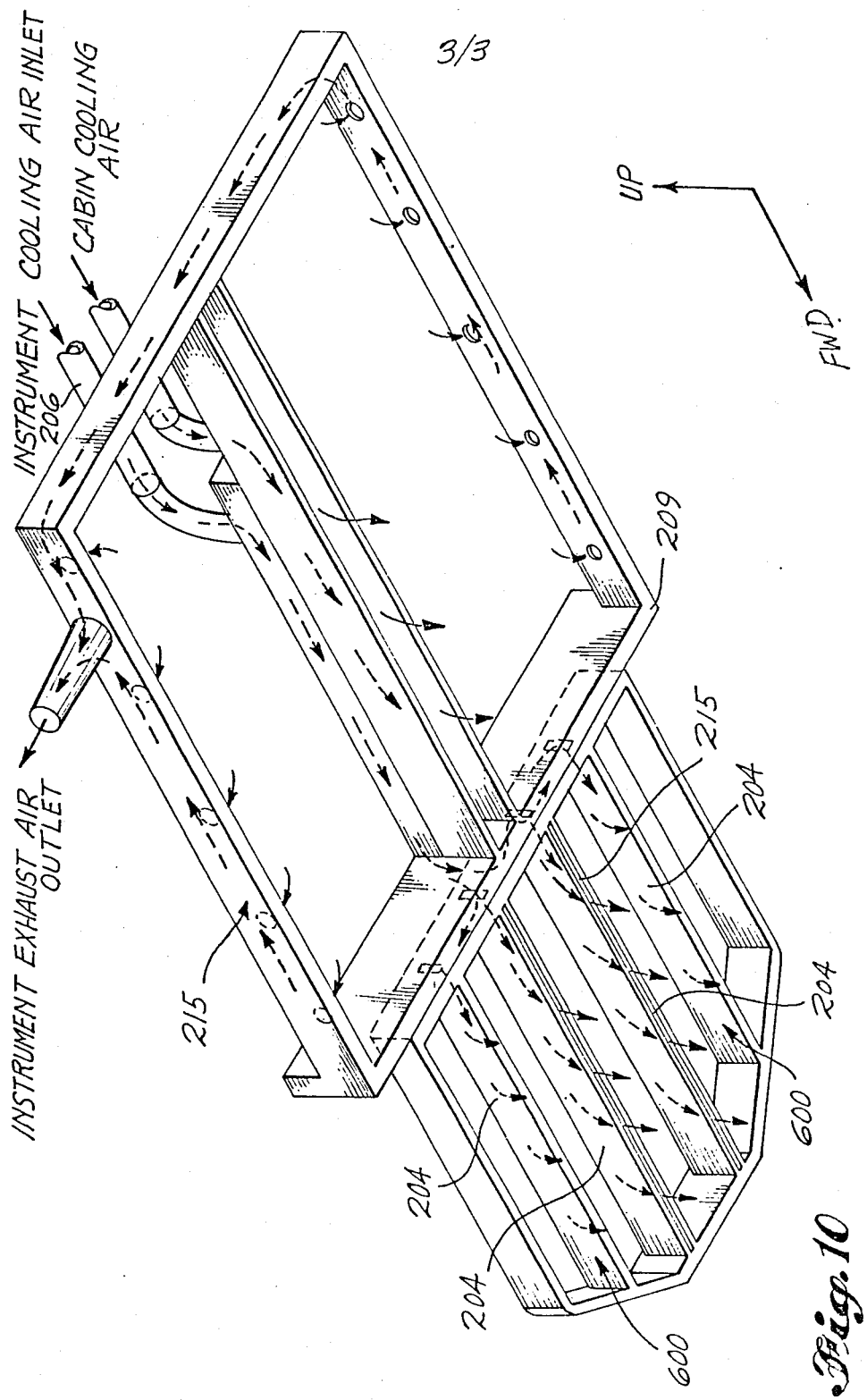

FIG. 10 is a perspective view of a further instrument module support rail assembly and depicts a support system which embodies a plurality of hollow instrument support rails 204, interconnected to a framework of hollow tubular members 209 which interface with sources for instrument-cooling air supply, air exhaust, and cabin cooling. The integrated framework provides support for the instruments, a minimum of connections to air sources, and a minimum of mechanical connections to the aircraft structure [not shown]. The instruments are not shown installed in FIG. 10; however, FIG. 1 illustrates a section through the forward portion of the framework depicting the instrument support framework, and their association with the aircraft structure and dripshield.

We claim:

1. In combination in the flight deck panel region of an aircraft:
    an instrument panel 200;
    a plurality of dripshields 213 desposed inside the aircraft skin and a plurality of instrument modules 201 distributed in spaced apart relationship between said instrument panel 200 and said plurality of dripshields 213;
    a plurality of ventilated instrument support rail assemblies 204, each of said plurality of ventilated instrument support rail assemblies 204 disposed between said instrument modules 201 and supporting said instrument modules;
    each of said plurality of ventilated instrument support rail assemblies 204 including a cooling air source manifold 302, and an instrument module support 301, 501 retaining said instrument modules in said distributed spaced apart relationship;
    said cooling air source manifold 302 including coupling means 303, 206 disposed between supply air ducting 209, hollow tubular members 210, and said ventilated instrument support rail 204; and,
    said coupling means 303, 206 comprising a plurality of air dispersion passages 304 distributed along said manifold 302 adjacent to said instrument module support 301, 501 for dispersing cooling air to said instrument modules 201.

2. The invention according to claim 1 wherein said cooling air source manifold 302 includes spring means 402 for porting air flow from said manifold to one of said CRT 605, CRT 617, or instrument modules 201 upon attachment of said CRT or instrument module to said instrument module support 301, 501.

* * * * *